(12) United States Patent
He

(10) Patent No.: US 10,546,980 B2
(45) Date of Patent: Jan. 28, 2020

(54) PROCESS METHOD USING THERMOPLASTIC RESIN PHOTOCONVERTER TO BOND-PACKAGE LED BY ROLLING

(71) Applicant: Jiangsu Cherrity Optronics Co., Ltd., Jiangning, Nanjing (CN)

(72) Inventor: Jinhua He, Jiangning Nanjing (CN)

(73) Assignee: Jiangsu Cherrity Optronics Co., Ltd. (CN)

( * ) Notice: Subject to any disclaimer, the term of this patent is extended or adjusted under 35 U.S.C. 154(b) by 151 days.

(21) Appl. No.: 15/737,773

(22) PCT Filed: Dec. 16, 2015

(86) PCT No.: PCT/CN2015/097624
§ 371 (c)(1),
(2) Date: Oct. 12, 2018

(87) PCT Pub. No.: WO2017/028417
PCT Pub. Date: Feb. 23, 2017

(65) Prior Publication Data
US 2019/0035985 A1 Jan. 31, 2019

(30) Foreign Application Priority Data
Aug. 18, 2015 (CN) .......................... 2015 1 0508066

(51) Int. Cl.
*H01L 33/50* (2010.01)
*H01L 33/52* (2010.01)

(52) U.S. Cl.
CPC ............ *H01L 33/505* (2013.01); *H01L 33/50* (2013.01); *H01L 33/52* (2013.01); *H01L 2933/0033* (2013.01); *H01L 2933/0041* (2013.01)

(58) Field of Classification Search
CPC .......... H01L 33/505; H01L 2933/0033; H01L 2933/0041
(Continued)

(56) References Cited

U.S. PATENT DOCUMENTS

2003/0070274 A1* 4/2003 Ohba ..................... G09F 9/35
29/428
2003/0203104 A1* 10/2003 Crommentuyn ....... B05D 1/007
427/180
(Continued)

FOREIGN PATENT DOCUMENTS

CN 1667845 A 9/2005
CN 102881780 A 1/2013
(Continued)

OTHER PUBLICATIONS

International Search Report and Written Opinion by the Australian Patent Office for PCT/US2017/060625, dated Dec. 19, 2017, 13 pp.

*Primary Examiner* — Sheikh Maruf
(74) *Attorney, Agent, or Firm* — Edwin S. Flores; Chalker Flores, LLP

(57) ABSTRACT

A process method for bond-packaging an LED using a thermoplastic resin photoconverter by rolling includes at least the following continuous process flow: preparation of a photoconversion sheet, shaping and cutting of a photoconversion sheet array, forming of LED package elements by roll-bonding, and curing of the LED package elements. The present invention has a significant advantage of bond-packaging the LED by continuous rolling, can meet a condition requirement of bond-packaging the LED using the thermoplastic resin photoconverter, and can enhance the production efficiency and yield of LED packages in industrialized batch production.

22 Claims, 17 Drawing Sheets

(58) Field of Classification Search
USPC .......................................................... 438/27
See application file for complete search history.

(56) References Cited

U.S. PATENT DOCUMENTS

| | | | | |
|---|---|---|---|---|
| 2006/0011288 A1* | 1/2006 | Watanabe | ............ | B32B 37/153 |
| | | | | 156/244.11 |
| 2008/0044940 A1* | 2/2008 | Watanabe | ............... | B32B 37/20 |
| | | | | 438/64 |
| 2010/0291313 A1* | 11/2010 | Ling | ..................... | C09K 11/02 |
| | | | | 427/475 |
| 2011/0031516 A1* | 2/2011 | Basin | .................. | H01L 33/507 |
| | | | | 257/98 |
| 2011/0174605 A1* | 7/2011 | Ugolin | ..................... | B01D 1/16 |
| | | | | 203/10 |
| 2013/0143339 A1* | 6/2013 | Tischler | .................. | H01L 33/50 |
| | | | | 438/27 |
| 2013/0187174 A1* | 7/2013 | Tischler | .................. | H01L 27/14 |
| | | | | 257/80 |
| 2014/0191257 A1* | 7/2014 | Tischler | .............. | H01L 23/4985 |
| | | | | 257/88 |
| 2015/0079709 A1* | 3/2015 | Tischler | ................ | H01L 33/502 |
| | | | | 438/27 |
| 2015/0194585 A1* | 7/2015 | Kim | ........................ | H01L 33/62 |
| | | | | 257/99 |
| 2016/0185074 A1* | 6/2016 | Kagawa | .............. | H01L 23/3737 |
| | | | | 428/341 |

FOREIGN PATENT DOCUMENTS

| | | | |
|---|---|---|---|
| CN | 203839411 U | | 9/2014 |
| CN | 104170101 A | * | 11/2014 |
| CN | 104170101 A | | 11/2014 |
| WO | 2017028417 A1 | | 2/2017 |

* cited by examiner

PROCESS METHOD USING THERMOPLASTIC RESIN PHOTOCONVERTER TO BOND-PACKAGE LED BY ROLLING

CROSS-REFERENCE TO RELATED APPLICATIONS

This application is the National Stage of International Application No. PCT/CN2015/097624, filed on Dec. 16, 2015 claiming the priority of CN 201510508066.6, filed on Aug. 18, 2015, the content of each of which is incorporated by reference herein.

TECHNICAL FIELD

The present invention relates to the technical field of LED packaging using a photoconverter, and in particular, to a process method for bond-packaging an LED using a thermoplastic resin photoconverter by rolling.

BACKGROUND

With the advantages such as high brightness, low heat, long service life, and being environmentally friendly and renewable, LEDs are known as the most promising new generation of green light sources in the 21st century. At present, the theoretical service life of the LED can be over 100,000 hours. However, during actual application, limited by many factors such as chip failure package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED. For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process method. For example, die bonding, wire soldering, and even light splitting in the conventional LED upright packaging are no longer needed. In this way, the LED flip-chip packaging is increasingly widely applied. However, it should also be noted that, the existing flip-chip LED packaging technologies mostly bond a photoconverter made of an organic silicone resin to a flip chip LED using a casting process, a screen printing process, an upper and lower flat plate molding process, a single roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mold or lens cover with silica gel; and (f) baking the whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mode or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, an intelligent control system is not equipped to control the whole LED chip packaging process, which directly affects improvement of the yield.

Chinese patent application NO. 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, and there is no intelligent control system for accurate control, thus inevitably reducing the yield.

Chinese patent application NO. 201380027218.X discloses a "resin sheet laminate, and manufacturing method for semiconductor light-emitting element using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of a semiconductor light-emitting element to which the fluorophor-containing resin layer is attached, and make it easy to manufacture and free to design the element. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting element, which may damage the semiconductor light-emitting element. Thirdly, in the bonding stage using an adhesive in the fluorophor-containing resin layer, it is difficult to eliminate residuals from the semiconductor light-emitting element after bonding, and pores easily occur in the bonding procedure, thus reducing the yield; in addition, existence of the bonding layer reduces light emission efficiency of the LED element. Fourthly, the substrate under the fluorescent resin sheet bonded to the light emitting surface of the semiconductor light-emitting element is not removed, which directly affects luminous efficacy of the semiconductor light-emitting element. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole element. An error in arrangement positions of the multiple regions directly affects the precision of subsequent bonding with the light-emitting element. If the multiple regions cannot be rendered uniform in size and thickness, a severe problem of product inconsistency may emerge.

To sum up, how to overcome the defects in the prior art has become one of major difficulties to be solved in the technical field of LED packaging using a photoconverter.

SUMMARY OF THE INVENTION

An objective of the present invention is to overcome the defects in the prior art and provide a process method for bond-packaging an LED using a thermoplastic resin photoconverter by rolling. The present invention has a significant advantage of bond-packaging the LED by continuous rolling, can meet a condition requirement of bond-packaging the LED using the thermoplastic resin photoconverter, and enhance the production efficiency and yield of LED packages in industrialized batch production.

The process method for bond-packaging an LED using a thermoplastic resin photoconverter by rolling provided by the present invention includes at least the following continuous process flow: preparation of a photoconversion sheet, roll-shaping and roll-cutting of a photoconversion sheet array, forming of LED package elements by roll-bonding, and curing of the LED package elements. The method includes the following basic steps:

step 1: preparation of a photoconversion sheet: acquiring a photoconversion sheet formed by at least thermoplastic resin and a photoconversion material;

step 2: roll-shaping and roll-cutting of a photoconversion sheet array: in a vacuum condition, performing roll-shaping and roll-cutting on the photoconversion sheet in step 1 cooperatively by using a first rolling device with a protrusion array and a second rolling device with a recess array that are disposed face-to-face and aligned with each other, to obtain a photoconversion sheet array formed by individual photoconversion sheets with recesses, a slit for separating individual photoconversion sheets being formed between every two individual photoconversion sheets in the photoconversion sheet array;

step 3: forming of LED package elements by roll-bonding: in a vacuum condition, performing roll-bonding on the photoconversion sheet array in step 2 and a flip chip LED array with a carrier sheet, the photoconversion sheet array and the flip chip LED array facing each other and being aligned with each other, such that flip chip LEDs in the flip chip LED array are bonded to and embedded in the recesses on the individual photoconversion sheets of the photoconversion sheet array, to obtain LED package elements, the flip chip LED referring to an individual flip chip LED or an flip chip LED assembly, and the flip chip LED assembly being composed of two or more individual flip chip LEDs; and step 4: curing of the LED package elements: in a vacuum condition, curing the LED package elements by cooling, such that the individual photoconversion sheets bonded to the flip chip LED array contract and naturally close up, to obtain finished LED package elements.

As required, an extender may be used to extend an extensible carrier sheet of the finished LED package elements in step 4, such that the finished LED package elements are split along the slits after being extended, to obtain finished individual LED package elements.

An implementation principle of the present invention is as follows: To better solve the problems in the existing flip chip LED packaging process, the present invention subtly designs a novel process of bond-packaging an LED using a thermoplastic resin photoconverter by rolling. A principle of bond-packaging by rolling of the present invention is as follows: On one hand, in a vacuum condition, a roller is used to roll a thermoplastic resin photoconversion sheet to produce a plastic flow in sags and crests in the sheet, so as to eliminate possible residual pores, sags and crests, or other flaws produced during processing in the photoconversion sheet, thereby obtaining a flat refined photoconversion sheet without pores and having a uniform thickness. On the other hand, the rolled thermoplastic resin photoconversion sheet can be plastically deformed during processing, so as to form a photoconverter light emitting surface with a required optimal shape, such as a cambered surface, a hemispheric surface, or a spherical surface, thus improving the light emission efficiency and light emission uniformity of LED package elements. Moreover, the present invention provides a continuous process flow, which can meet processing conditions of batch production of LED package elements and achieve consistent specifications and dimensions. In this way, the production efficiency of the LED package elements is enhanced, brightness and color uniformity of finished LED package elements is improved, and the yield is greatly improved.

The present invention has the following remarkable advantages in comparison with the prior art:

First, the process method provided by the present invention is a novel process of LED bond-packaging by rolling, which solves the problems of low light emission efficiency, low yield, and low production efficiency of the LED bond-packaged by using existing conventional processes such as a casting process, a screen printing process, an upper and lower flat plate molding process, a single roller pressing process, and the like. The present invention can meet a requirement of a continuous process flow of bond-packaging the LED using the thermoplastic resin photoconverter, and enhance the production efficiency and yield of industrialized LED packaging in batches.

Secondly, the process method provided by the present invention can effectively eliminate possible residual pores, sags and crests, or other flaws produced during processing in the photoconversion sheet, thus significantly improving brightness and color uniformity of finished LED package elements. The yield of the LED package elements manufactured according to the present invention is obviously higher than that of an existing product of the same kind.

Thirdly, the present invention provides a cooperative roll-shaping and roll-cutting manner, that is, roll-shaping and roll-cutting are carried out simultaneously. Compared with a conventional process in which a fluorescent sheet and an LED chip are cut after being packaged, the manner of the present invention effectively ensures that individual photoconversion sheets in the photoconversion sheet array are uniform in size, thus ensuring the yield of finished LED package elements while simplifying the process procedures and greatly improving the production efficiency.

Fourthly, the present invention proposes an optimal photoconversion sheet shaped by rolling, which enhances the light emission efficiency and uniformity of the LED package elements.

Fifthly, the process method, which includes cooperative shaping and cutting of the photoconversion sheet array and forming of the LED package elements by bonding, provided by the present invention includes multiple implementation solutions. Thus, the defects in the existing process technology can be overcome, and additionally, it is suitable to equip an equipment system for implementing a continuous process and to carry out intelligent control, so as to meet a production requirement of industrialized LED packaging in batches. In this way, the production efficiency of industrialized LED packaging in batches is remarkably improved, brightness and color uniformity of finished LED package elements is greatly improved, and a light splitting stage in a conventional LED packaging process can be abolished.

Sixthly, the process method provided by the present invention is widely applicable to a packaging process of bonding the thermoplastic resin photoconverter to LED clip chips of different power, thus completely meeting a requirement of refining the product production and processing during industrialized LED packaging in batches.

BRIEF DESCRIPTION OF THE DRAWINGS

FIG. 13A-1 is a left view, FIG. 13A-2 is a right view, FIG. 13A-3 is a bottom view, and FIG. 13A-4 is a three-dimensional view;

FIG. 13B-1 is a left view, FIG. 13B-2 is a right view, FIG. 13B-3 is a bottom view, and FIG. 13B-4 is a three-dimensional view; FIG. 13C-1 is a left view, FIG. 13C-2 is a right view, FIG. 13C-3 is a bottom view, and FIG. 13C-4 is a three-dimensional view.

Figure 1:
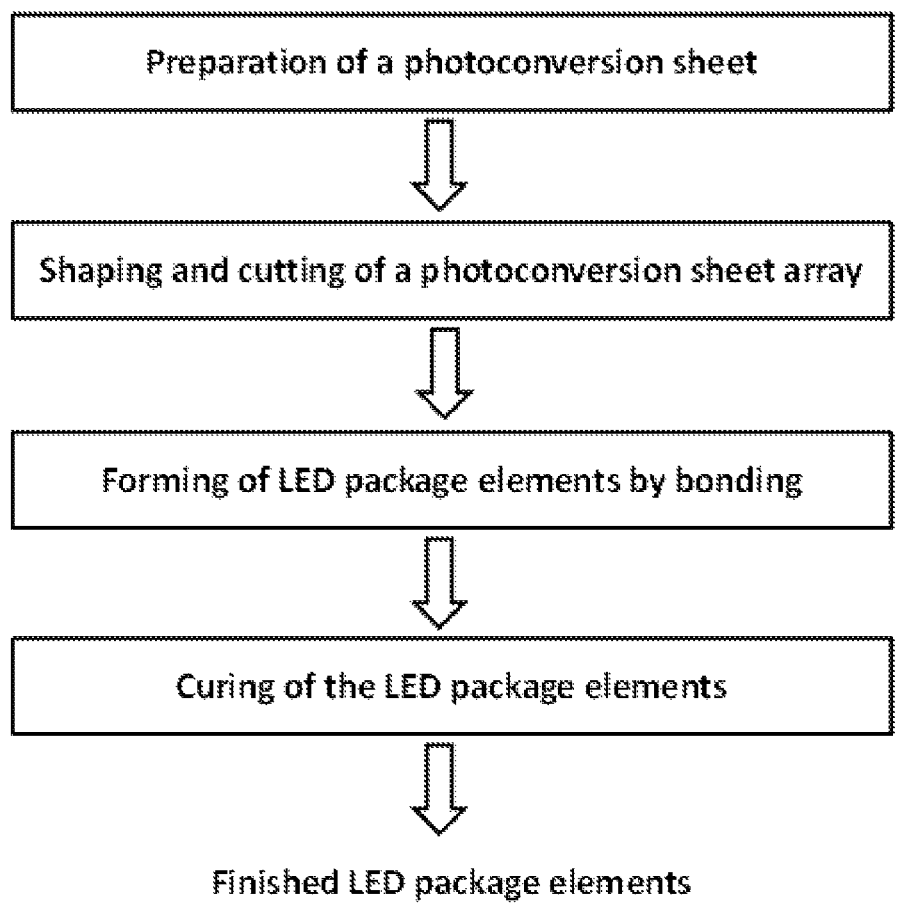
FIG. 1 is a schematic block diagram of procedures of a process for bond-packaging an LED using a thermoplastic resin photoconverter by rolling according to the present invention.

Meaning of numerals in the accompanying drawings of the present invention:

1-1 Melting and blending apparatus
2-1 and 2-2 Two smooth-surface single-wheeled rollers each having a smooth rolling surface of a first smooth-surface double-roller roll laminator
2-3 and 2-4 Two smooth-surface single-wheeled rollers each having a smooth rolling surface of a second smooth-surface double-roller roll laminator
2-5 Mixed slurry
2-6 Rough photoconversion sheet
2-7 Refined photoconversion sheet
3-1 First single-wheeled roller with a protrusion array
3-2 Second single-wheeled roller with a recess array
3-3 Third single-wheeled roller with a smooth surface
3-4 Fourth single-wheeled roller with a recess array
3-5 Second planar conveyor with a recess array
3-6 Fourth planar conveyor with a recess array
4-1 Protrusion on a first single-wheeled roller
4-2 Recess on a second single-wheeled roller
4-3 Cutter on the periphery of protrusions
4-4 Photoconversion sheet with recesses
4-5 flip chip LED
4-6 Carrier sheet
4-7 LED package element
4-8 Cutter on the rims of recesses
4-9 Recess on a fourth single-wheeled roller
5 Curing apparatus
6-1 flip chip LED buffer roller
6-2 First buffer roller
6-3 Second buffer roller
7 Wind-up roller

DETAILED DESCRIPTION

Specific implementations of the present invention are described in detail below with reference to the accompanying drawings and embodiments.

Embodiment 1

Referring to FIGS. 1, 2, 8 and 10, the present invention provides a process for bond-packaging an LED using a thermoplastic resin photoconverter by rolling, which includes at least the following continuous process flow: preparation of a photoconversion sheet, roll-shaping and roll-cutting of a photoconversion sheet array, forming of LED package elements by roll-bonding, and curing of the LED package elements. The method includes the following basic steps:

step 1: preparation of a photoconversion sheet: acquiring a photoconversion sheet formed by at least thermoplastic resin and a photoconversion material;

step 2: roll-shaping and roll-cutting of a photoconversion sheet array: in a vacuum condition, performing roll-shaping and roll-cutting on the photoconversion sheet in step 1 cooperatively by using a first rolling device with a protrusion array and a second rolling device with a recess array that are disposed face-to-face and aligned with each other, to obtain a photoconversion sheet array formed by individual photoconversion sheets with recesses, a slit for separating the individual photoconversion sheets being formed between every two individual photoconversion sheets in the photoconversion sheet array;

step 3: forming of LED package elements by roll-bonding: in a vacuum condition, performing roll-bonding on the photoconversion sheet array in step 2 and a flip chip LED array with a carrier sheet, the photoconversion sheet array and the flip chip LED facing each other and aligned with each other, such that flip chip LEDs in the flip chip LED array are bonded to and embedded in the recesses on the individual photoconversion sheets of the photoconversion sheet array, to obtain LED package elements, the flip chip LED referring to an individual flip chip LED or a flip chip LED assembly, and the flip chip LED assembly being composed of two or more individual flip chip LEDs; and step 4: curing of the LED package elements: in a vacuum condition, curing the LED package elements by cooling, such that the photoconversion sheets bonded to the flip chip LED array contract and naturally close up, to obtain finished LED package elements.

It should be particularly noted that:

The present invention is applicable to production and processing of a photoelectric device or an electronic device of a structure similar to that of a LED flip chip.

Any existing thermoplastic resin having high light transmittance and desirable temperature resistance may be selected to be used in the process method of the present invention. In order to meet a temperature condition for reflow soldering of a common LED package element in use, the present invention preferably uses thermoplastic resin with a thermal deformation temperature ranging from 120° C. to 250° C. An existing quantum dot fluorophor and existing fluorescent powder can both be selected to be used in the process method of the present invention.

In a general case, mixed slurry used in the present invention does not need to contain an adhesive. When finished LED package elements are used in an extreme condition and adhesion between a photoconverter and a flip chip LED needs to be further enhanced, the mixed slurry used in the present invention may contain an adhesive.

Further preferred solutions of the process for bond-packaging an LED using a thermoplastic resin photoconverter by rolling according to the present invention are as follows:

The preparation of a photoconversion sheet in step 1 refers to: rolling mixed slurry containing at least the thermoplastic resin and the photoconversion material by using a smooth-surface double roller in a vacuum heating condition, to obtain the photoconversion sheet. The rolling mixed slurry by using a smooth-surface double roller to obtain the photoconversion sheet refers to: first rolling and molding the mixed slurry by using a first smooth-surface double-roller roll laminator, to obtain a rough photoconversion sheet; and then rolling and molding the molded rough photoconversion sheet by using a second smooth-surface double-roller roll laminator, to obtain a refined photoconversion sheet. The thickness of the rough photoconversion sheet is no more than 850 and the thickness of the refined photoconversion sheet is no more than 800 μm.

Figure 3:
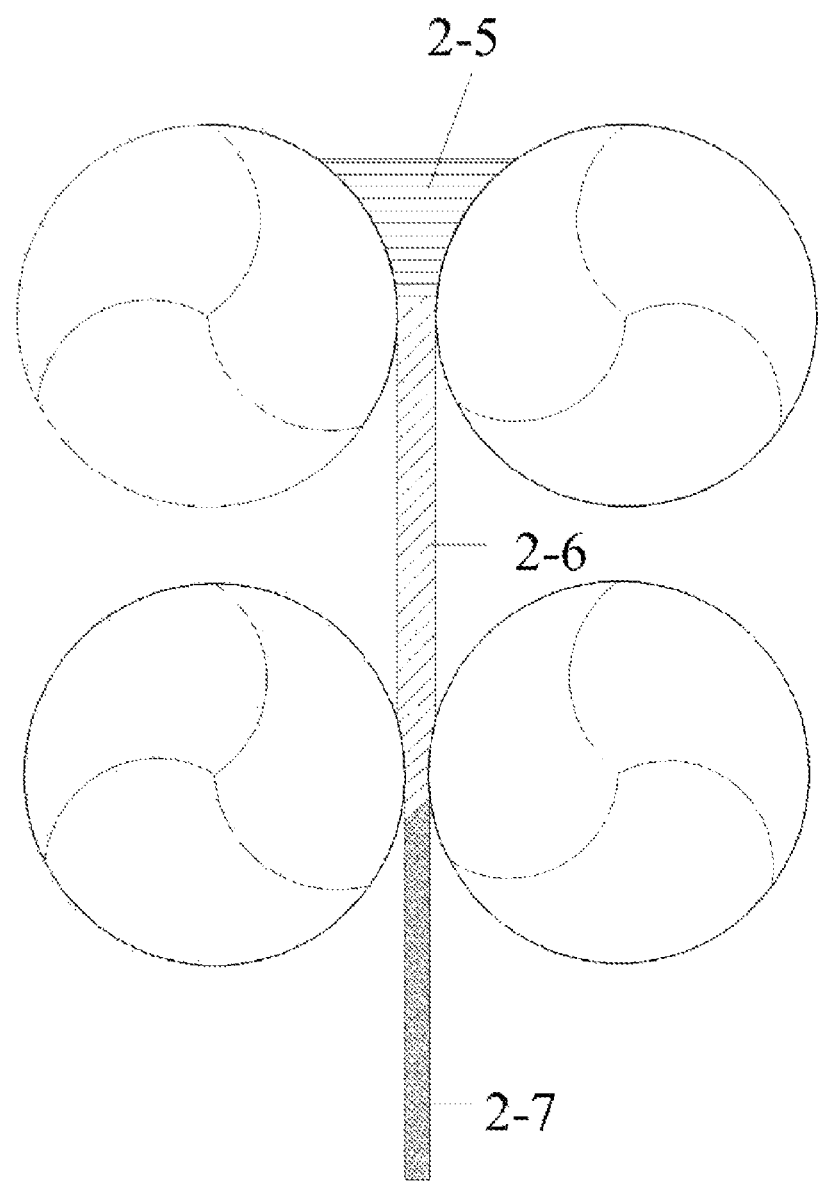
FIG. 3 is a schematic diagram of a stage of preparing a photoconversion sheet in the schematic structural diagram of the first flow layout shown in FIG. 2.

The rolling mixed slurry by using a smooth-surface double roller to obtain the photoconversion sheet refers to: rolling and molding the mixed slurry by using three or more sets of double rollers, to obtain a refined photoconversion sheet, the thickness of the refined photoconversion sheet being no more than 200 Materials of the mixed slurry may further include an adhesive, as shown in FIG. 3.

The melting temperature of the thermoplastic resin selected in step 1 ranges from 180° C. to 320° C. The optimal melting temperature of the thermoplastic resin ranges from 240° C. to 280° C.

The temperature of the mixed slurry in step 1 ranges from 180° C. to 320° C. The optimal temperature of the mixed slurry ranges from 240° C. to 280° C.

The photoconversion material in step 1 is a quantum dot fluorophor, and the photoconversion sheet is a quantum dot fluorophor sheet.

The photoconversion material in step 1 is fluorescent powder, and the photoconversion sheet is a fluorophor sheet.

Step 2 of performing roll-shaping and roll-cutting on the photoconversion sheet cooperatively by using a first rolling device with a protrusion array and a second rolling device with a recess array that are disposed face-to-face and aligned with each other refers to: performing roll-shaping and roll-cutting on the photoconversion sheet simultaneously by using the first rolling device with a protrusion array and the second rolling device with a recess array that are disposed face-to-face and aligned with each other, that is, simultaneously carrying out roll-shaping and roll-cutting, to achieve the two functions at the same time.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping on the photoconversion sheet by using the first rolling device with a protrusion array and the second rolling device with a recess array, to obtain a photoconversion sheet array formed by individual photoconversion sheets with recesses. Cutters are provided on the periphery of protrusions of the protrusion array and/or the rims of recesses of the recess array, such that roll-cutting for forming a slit is performed on the photoconversion sheet while roll-shaping is performed, to form slits for separating the individual photoconversion sheets.

Figure 5A:
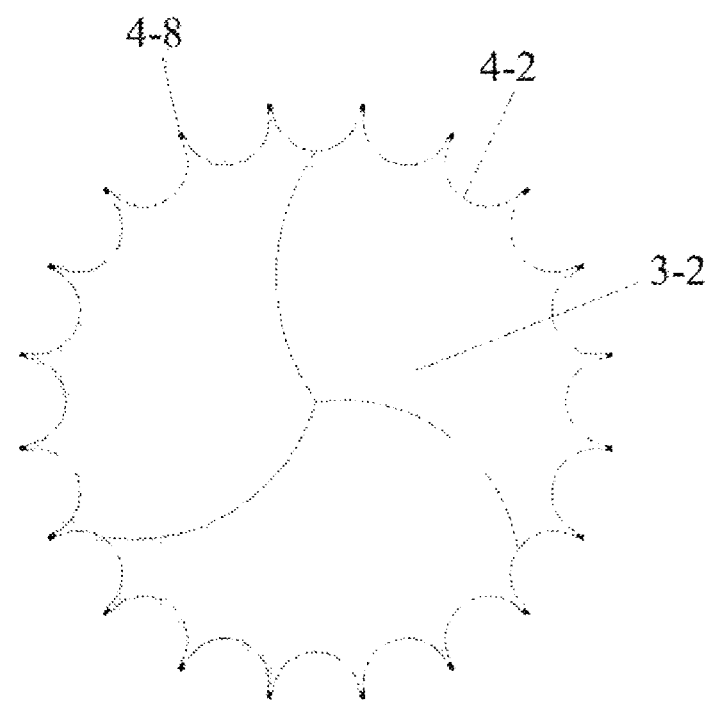
FIG. 5A is a schematic structural diagram of a cutting manner 1 in shaping and cutting of the photoconversion sheet array in the schematic structural diagram of the first flow layout shown in FIG. 2.
Figure 5B:
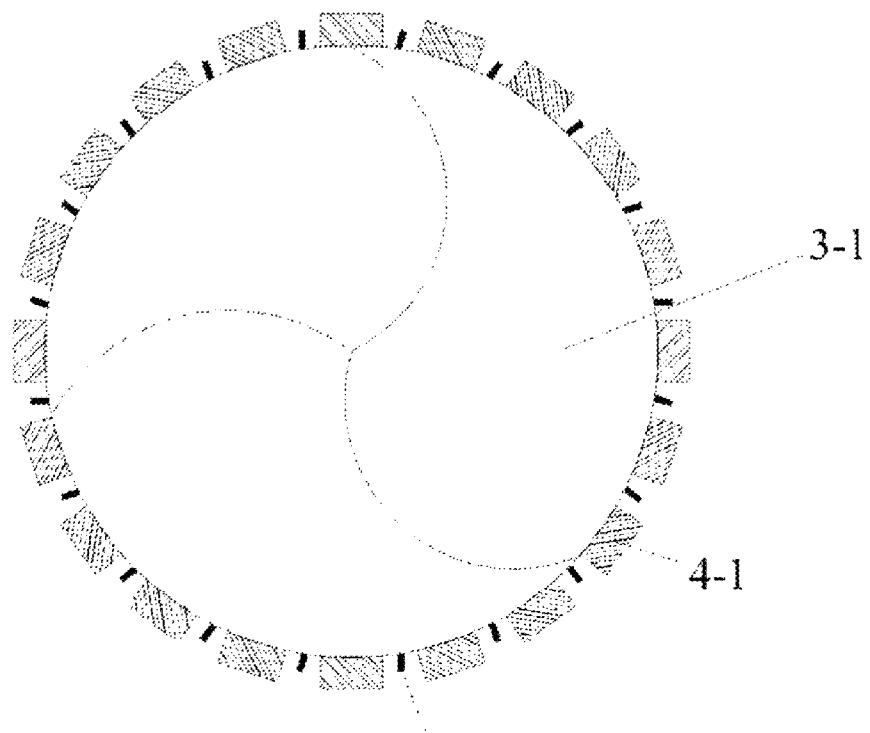
FIG. 5B is a schematic structural diagram of a cutting manner 2 in shaping and cutting of the photoconversion sheet array in the schematic structural diagram of the first flow layout shown in FIG. 2.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a double-roller rolling device with both a protrusion array and a recess array, the first rolling device with a protrusion array being a first single-wheeled roller with a protrusion array in the double-roller rolling device, the second rolling device with a recess array being a second single-wheeled roller with a recess array in the double-roller rolling device, and cutters being provided on the periphery of protrusions of the first single-wheeled roller with a protrusion array and/or the rims of recesses of the second single-wheeled roller with a recess array, as shown in FIG. 5A and FIG. 5B.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first single-wheeled roller with a protrusion array and a second planar conveyor with a recess array, the first rolling device with a protrusion array being the first single-wheeled roller with a protrusion array, the second rolling device with a recess array being the second planar conveyor with a recess array, and cutters being provided on the periphery of protrusions of the first single-wheeled roller with a protrusion array and/or the rims of recesses of the second planar conveyor with a recess array.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first planar conveyor with a protrusion array and a second single-wheeled roller with a recess array, the first rolling device with a protrusion array being the first planar conveyor with a protrusion array, the second rolling device with a recess array being the second single-wheeled roller with a recess array, and cutters being provided on the periphery with protrusions of the first planar conveyor with a protrusion array and/or rims with recesses of the second single-wheeled roller with a recess array.

The shape of each individual photoconversion sheet in the photoconversion sheet array formed by the individual photoconversion sheets with recesses in step 2 is a cambered surface, a hemispheric surface or a planar surface.

The temperature of cooperative roll-shaping and roll-cutting in step 2 ranges from 120° C. to 250° C.

For example, when polymethyl methacrylate (PMMA) is used as the thermoplastic resin, the temperature of cooperative roll-shaping and roll-cutting in step 2 is preferably 120° C.; when modified polymethyl methacrylate (M-PMMA) is used as the thermoplastic resin, the temperature of cooperative roll-shaping and roll-cutting in step 2 is preferably 200° C.; and when modified polycarbonate (M-PC) is used as the thermoplastic resin, the temperature of cooperative roll-shaping and roll-cutting in step 2 is preferably 250° C.

The depth of the slit in step 2 is 50% to 100% of the thickness of the photoconversion sheet. An optimal depth of the slit is 70% to 80% of the thickness of the photoconversion sheet.

The width of the slit in step 2 is no more than 20 μm.

The width of the slit in step 2 depends on the width of the cutter provided on the periphery with protrusions or rims with recesses in the roll-shaping and roll-cutting of the present invention, and is preferably 15 μm.

Dimensions of the length, width, and height of each recess on the photoconversion sheet array formed by the individual photoconversion sheets with recesses in step 2 are 1.01 to 1.05 times over those of a flip chip LED.

The dimensions of the length, width, and height of the recess on the photoconversion sheet array formed by the individual photoconversion sheets with recesses in the present invention depend on a rate of contraction of the thermoplastic resin. Preferably, the dimensions of the length, width, and height of the recess are 1.02 times of those of the flip chip LED.

The roll-bonding in step 3 refers to: arranging the photoconversion sheet array on a fourth single-wheeled roller with a recess array or a fourth planar conveyor with a recess array, arranging the flip chip LED array with a carrier sheet on a third single-wheeled roller with a smooth rolling surface or a third planar conveyor with a smooth plane, and then performing roll-bonding, such that the flip chip LED in the flip chip LED array are bonded to and embedded in the recesses on the individual photoconversion sheets of the photoconversion sheet array, to obtain the LED package elements, at least one of the device arranged with the photoconversion sheet array and the device arranged with the flip chip LED array being a single-wheeled roller.

The temperature of the roll-bonding in step 3 ranges from 120° C. to 250° C. The optimal temperature of the roll-bonding ranges from 180° C. to 220° C.

The carrier sheet in the flip chip LED array with a carrier film in step 3 is an extensible carrier film.

A material of the extensible carrier sheet in step 3 is one of heat-resistant polyester, polydimethylsiloxane, and polyvinyl chloride.

The curing by cooling in step 4 is curing by gradient cooling or curing by steady cooling.

The curing by gradient cooling refers to decreasing the temperature of the LED package elements to room temperature along multiple gradients, duration of the curing by cooling being 3 min to 10 min, and duration of each stage of the curing by cooling being adjustable.

The curing by steady cooling refers to decreasing the temperature of the LED package elements to room temperature steadily, duration of the curing by cooling being 3 min to 10 min.

Figure 2:
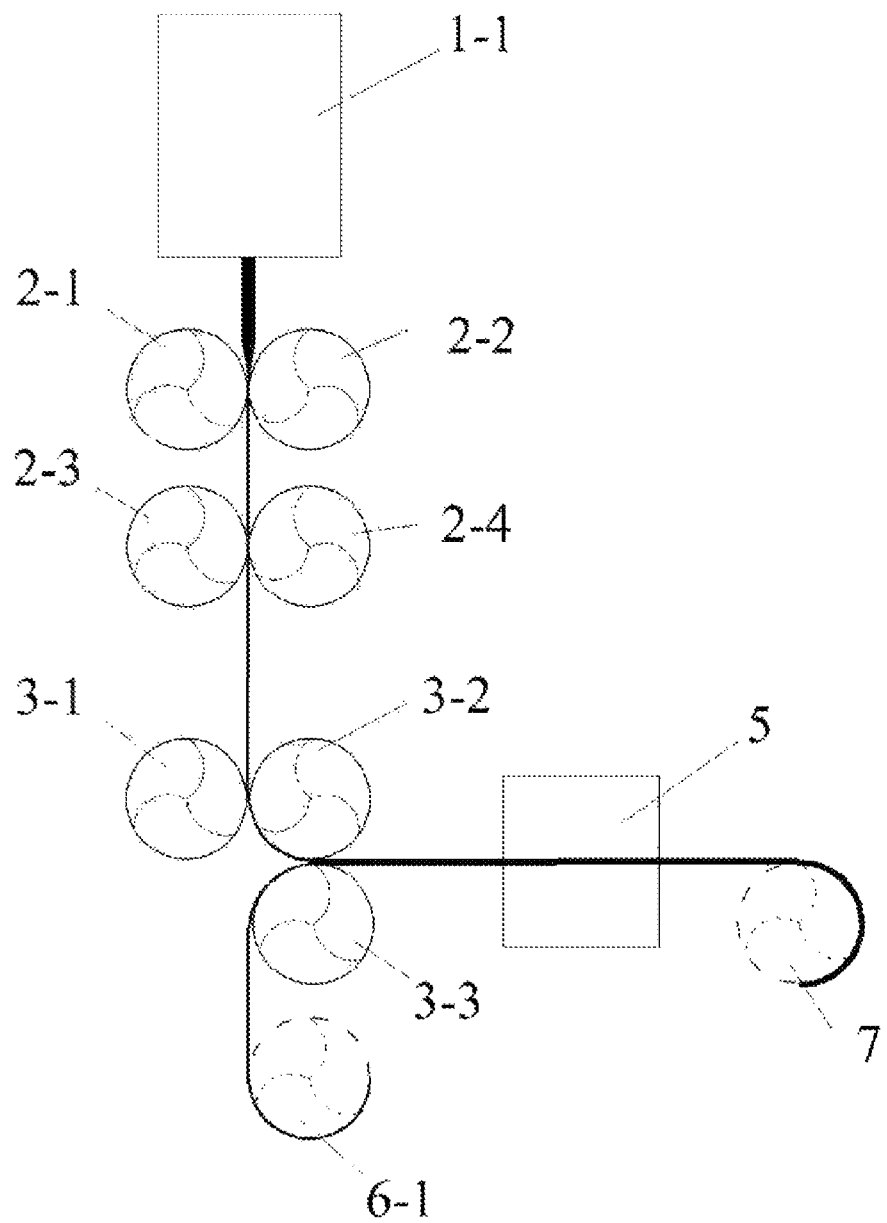
FIG. 2 is a schematic structural diagram of a first flow layout in the process for bond-packaging an LED using a thermoplastic resin photoconverter by rolling according to the present invention.
Figure 4:
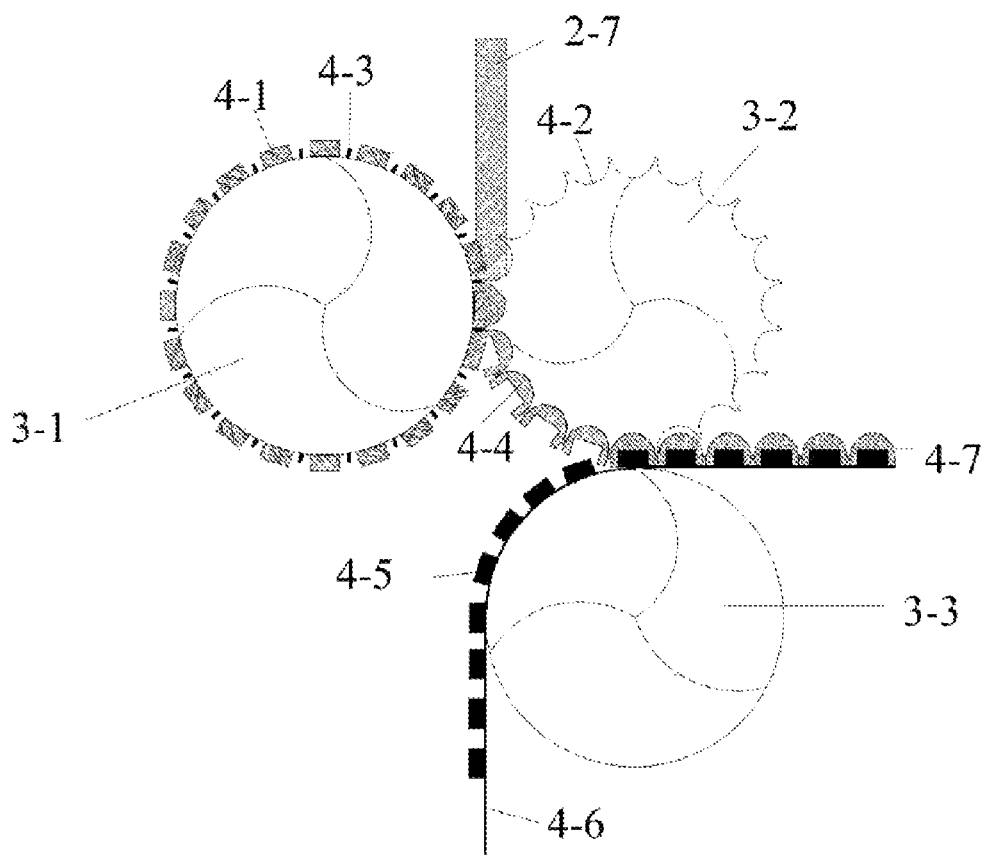
FIG. 4 is a schematic diagram of a stage of shaping and cutting a photoconversion sheet array and a stage of forming by bonding the photoconversion sheet array to a flip chip LED in the schematic structural diagram of the first flow layout shown in FIG. 2.

It should be further noted that, specific implementations of the cooperative roll-shaping and roll-cutting process and the roll-bonding process are as follows:

Refer to FIG. 4 for processes of performing roll-shaping and roll-cutting on the photoconversion sheet simultaneously by using the first single-wheeled roller with a protrusion array and the second single-wheeled roller with a recess array, and performing roll-bonding by using the second single-wheeled roller with a recess array and the third single-wheeled roller with a smooth surface to implement LED packaging, the flip chip LED array with the carrier sheet being arranged on the third single-wheeled roller. Refer to FIG. 2 for a process flow layout. In this embodiment, the fourth single-wheeled roller with a recess array and the second single-wheeled roller with a recess array are the same device.

Figure 6:
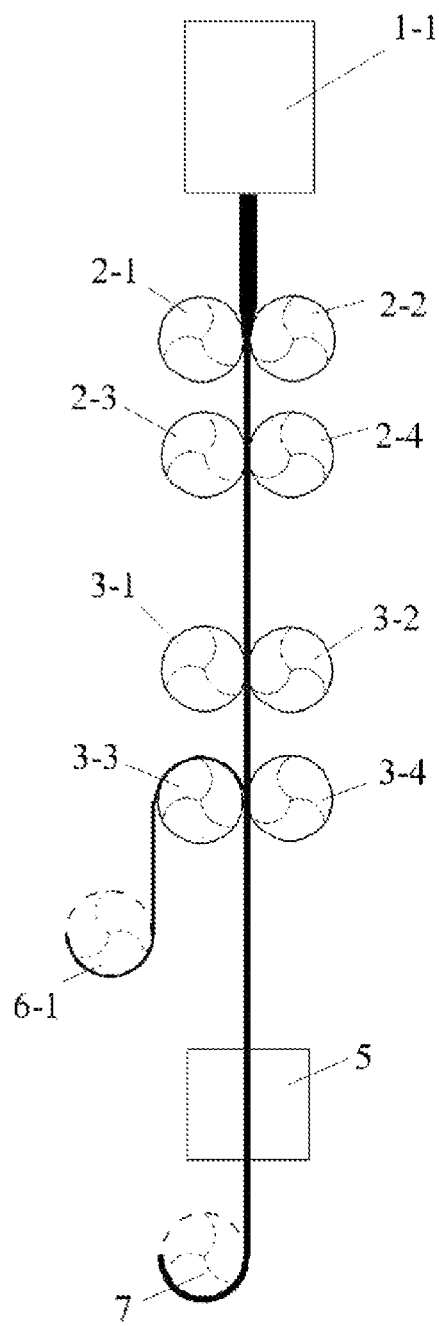
FIG. 6 is a schematic structural diagram of a second flow layout of the process for bond-packaging an LED using a thermoplastic resin photoconverter by rolling according to the present invention.
Figure 7:
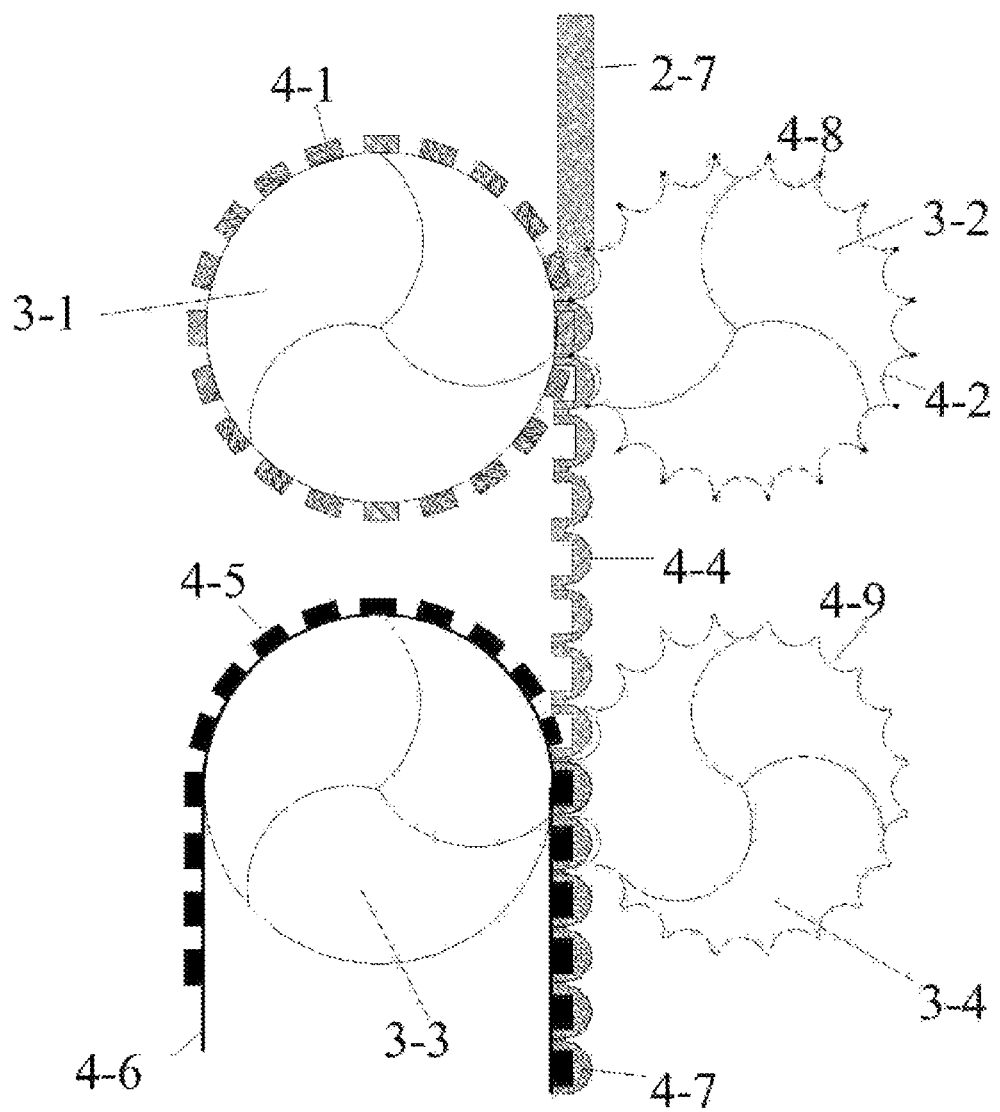
FIG. 7 is a schematic diagram of a stage of shaping and cutting a photoconversion sheet array and a stage of forming by bonding the photoconversion sheet array to a flip chip LED in the schematic structural diagram of the second flow layout shown in FIG. 6.

Refer to FIG. 7 for processes of performing roll-shaping and roll-cutting on the photoconversion sheet simultaneously by using the first single-wheeled roller with a protrusion array and the second single-wheeled roller with a recess array, and performing roll-bonding by using the fourth single-wheeled roller with a recess array and the third single-wheeled roller with a smooth surface to implement LED packaging, the flip chip LED array with the carrier sheet being arranged on the third single-wheeled roller. Refer to FIG. 6 for a process flow layout.

Figure 8:
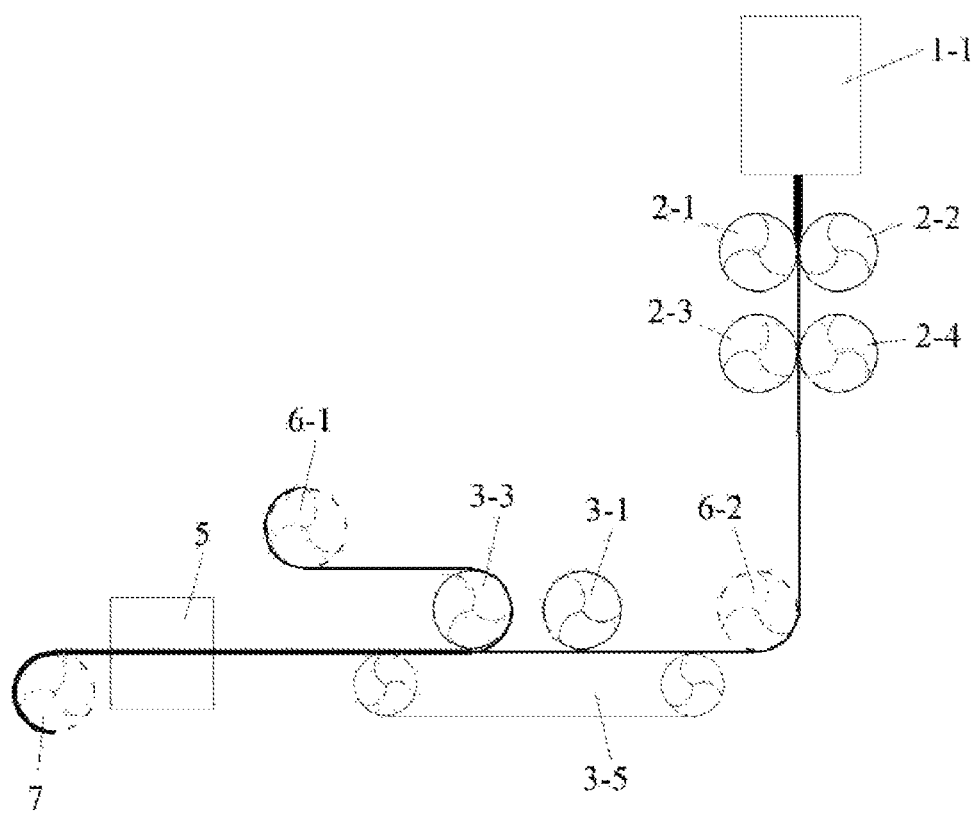
FIG. 8 is a schematic flowchart of a third flow layout of the process for bond-packaging an LED using a thermoplastic resin photoconverter by rolling according to the present invention.
Figure 9:
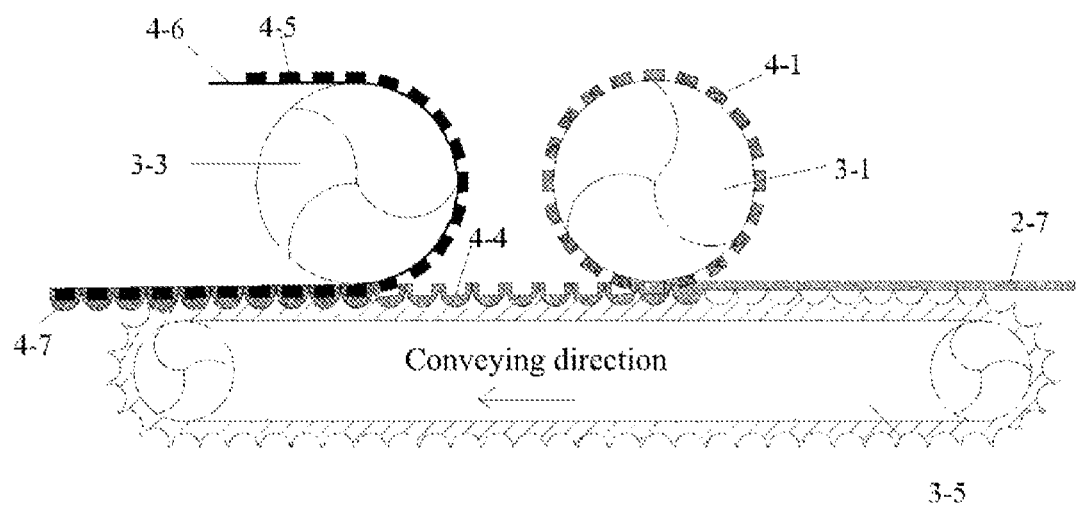
FIG. 9 is a schematic diagram of a stage of shaping and cutting a photoconversion sheet array and a stage of forming by bonding the photoconversion sheet array to a flip chip LED in the schematic structural diagram of the third flow layout shown in FIG. 8.

Refer to FIG. 9 for processes of performing roll-shaping and roll-cutting on the photoconversion sheet simultaneously by using the first single-wheeled roller with a protrusion array and the second planar conveyor with a recess array, and performing roll-bonding by using the second planar conveyor with a recess array and the third single-wheeled roller with a smooth surface to implement LED packaging, the flip chip LED array with the carrier sheet being arranged on the third single-wheeled roller. Refer to FIG. 8 for a process flow layout. In this embodiment, the fourth planar conveyor with a recess array and the second planar conveyor with a recess array are the same device.

Figure 10:
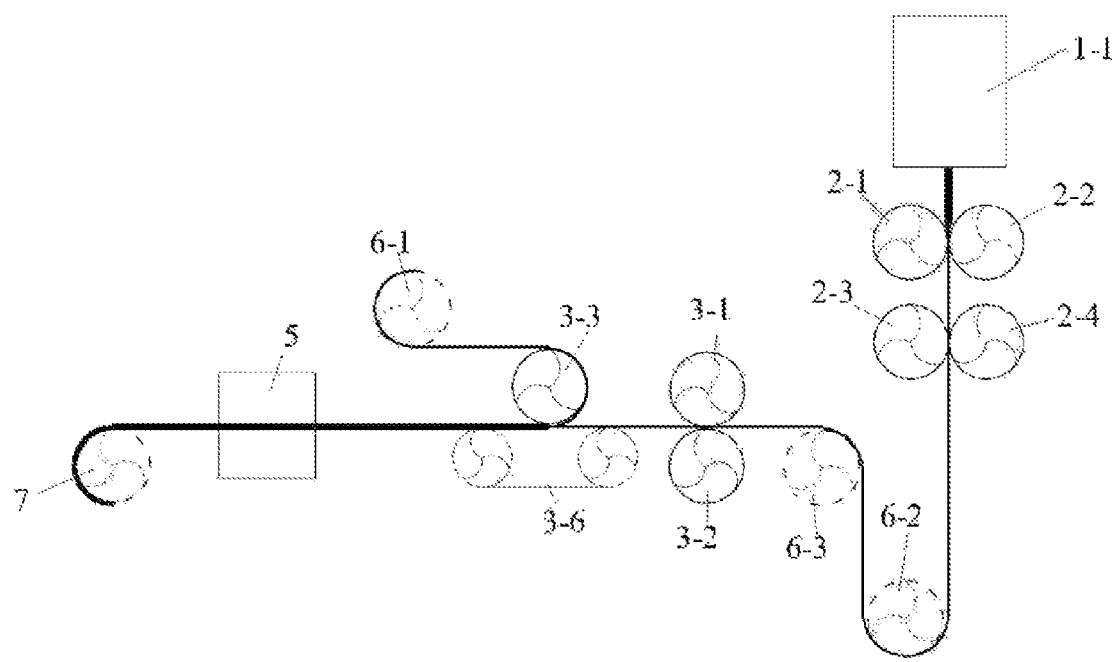
FIG. 10 is a schematic structural diagram of a fourth flow layout of the process for bond-packaging an LED using a thermoplastic resin photoconverter by rolling according to the present invention.
Figure 11A:
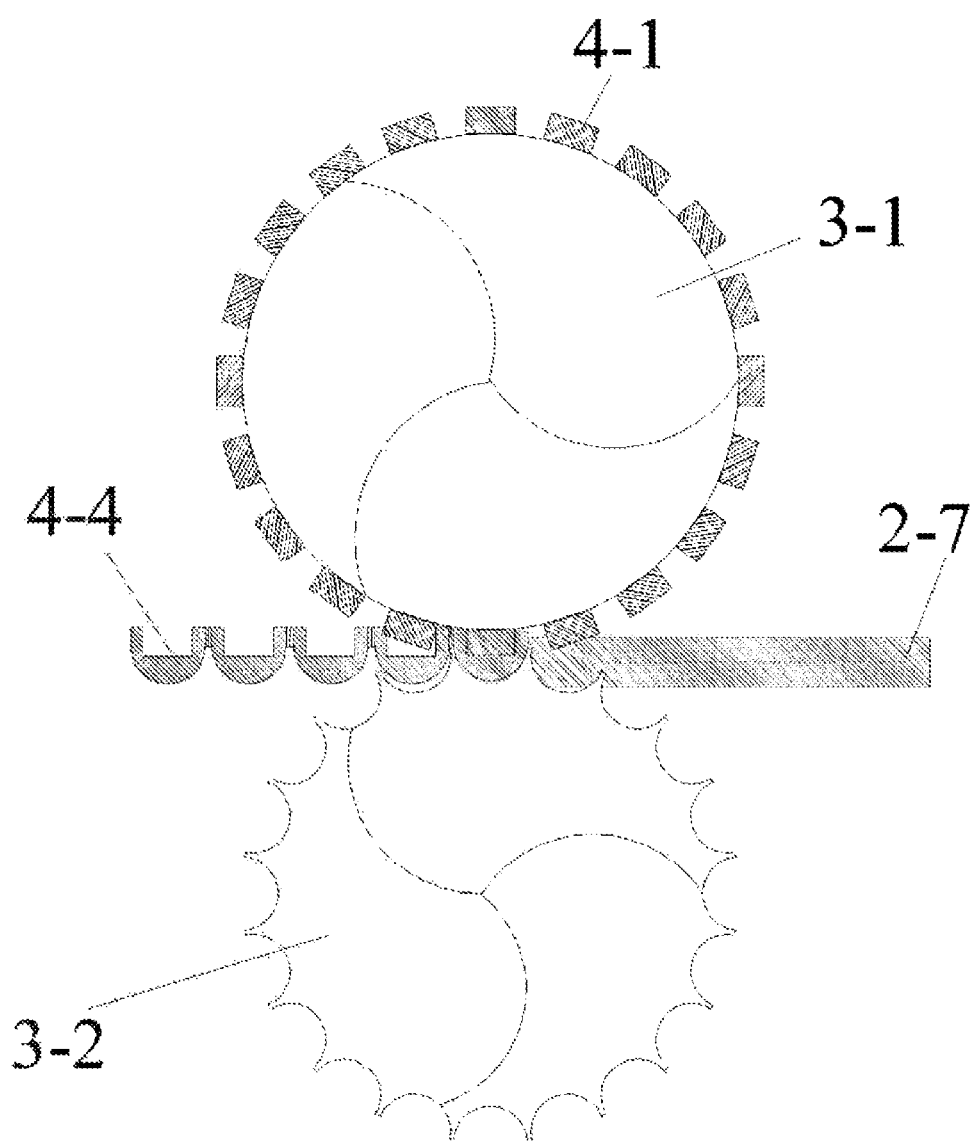
FIG. 11A is a schematic diagram of a stage of shaping and cutting a photoconversion sheet array in the schematic structural diagram of the fourth flow layout shown in FIG. 10.
Figure 11B:
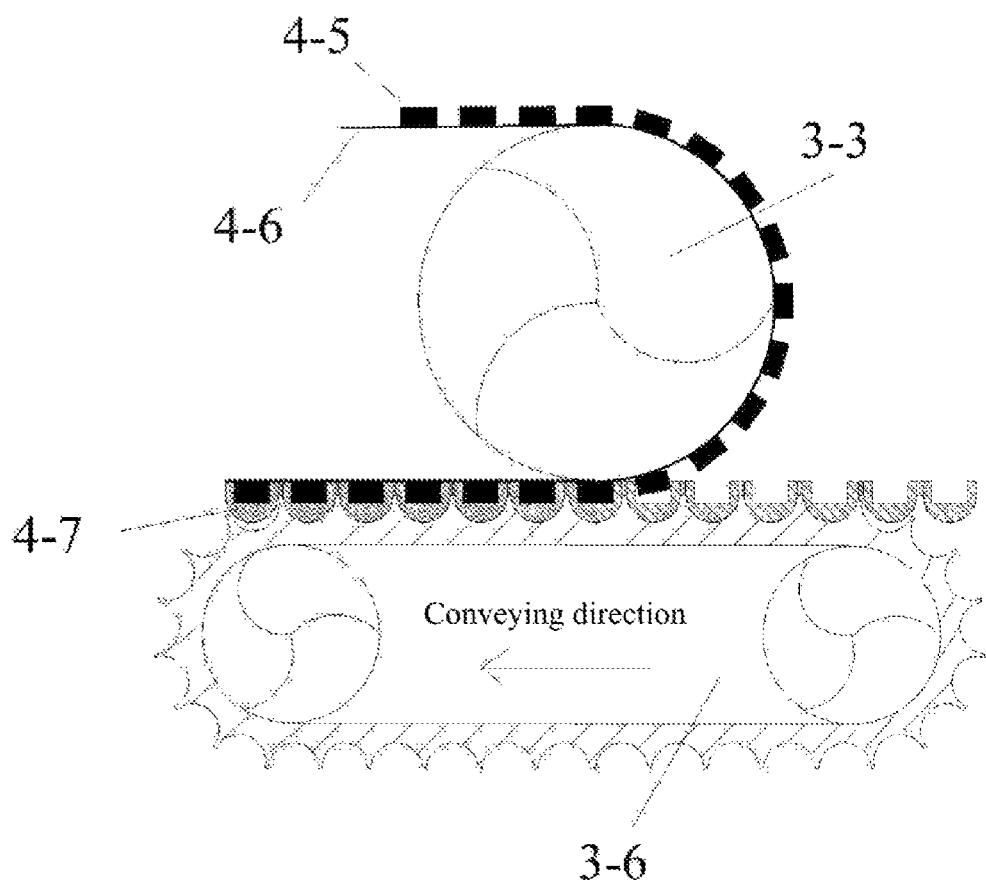
FIG. 11B is a schematic diagram of a stage of forming by bonding the shaped and cut photoconversion sheet array to the flip chip LED in the schematic structural diagram of the fourth flow layout shown in FIG. 10.

Refer to FIG. 11A and FIG. 11B for processes of performing roll-shaping and roll-cutting on the photoconversion sheet simultaneously by using the first single-wheeled roller with a protrusion array and the second single-wheeled roller with a recess array, and performing roll-bonding by using the fourth planar conveyor with a recess array and the third single-wheeled roller with a smooth surface to implement LED packaging, the flip chip LED array with the carrier sheet being arranged on the third single-wheeled roller. Refer to FIG. 10 for a process flow layout.

Figure 12A:
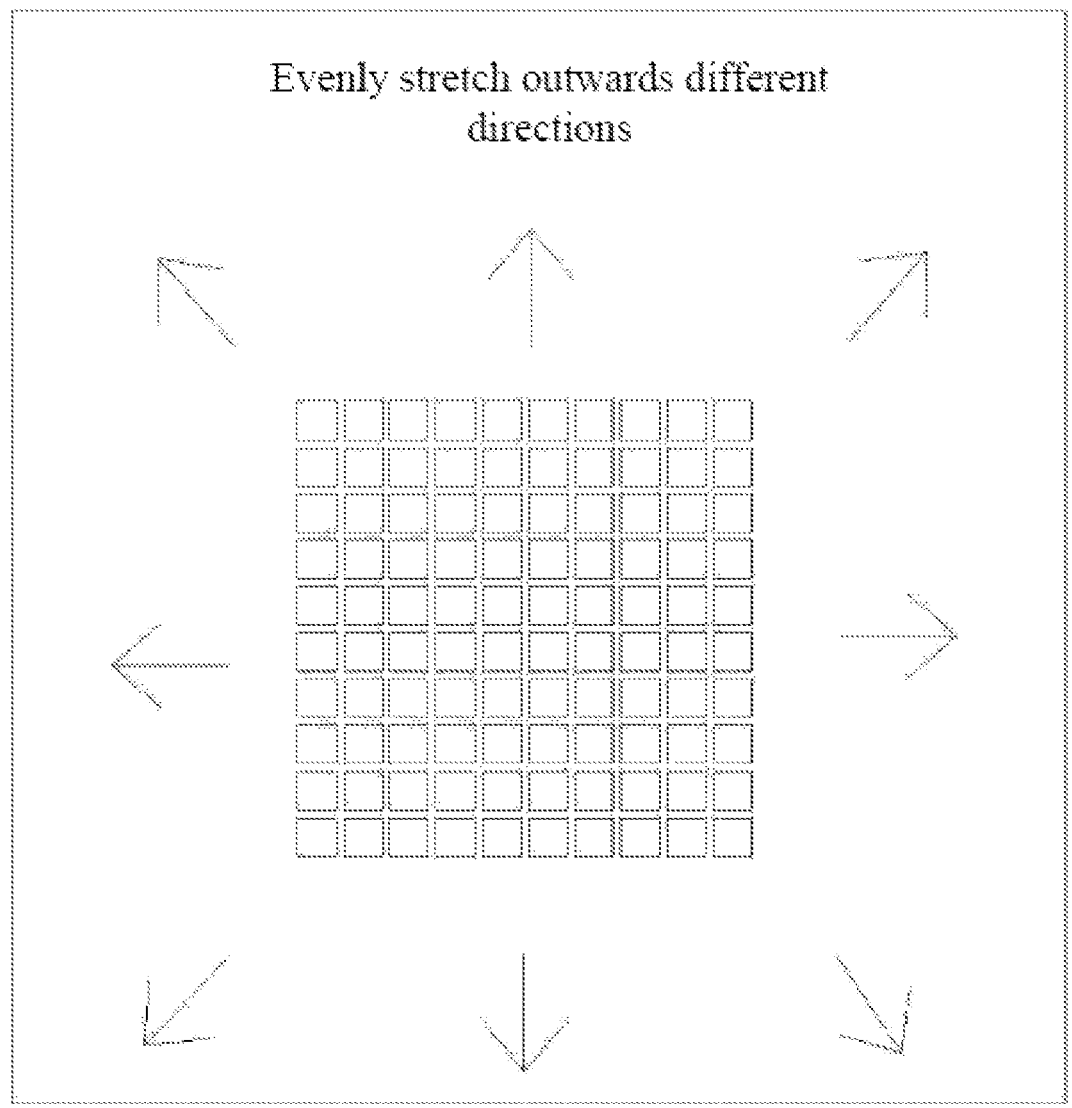
FIG. 12A is a schematic planar structural diagram of finished LED package elements manufactured according to the present invention.
Figure 12B:
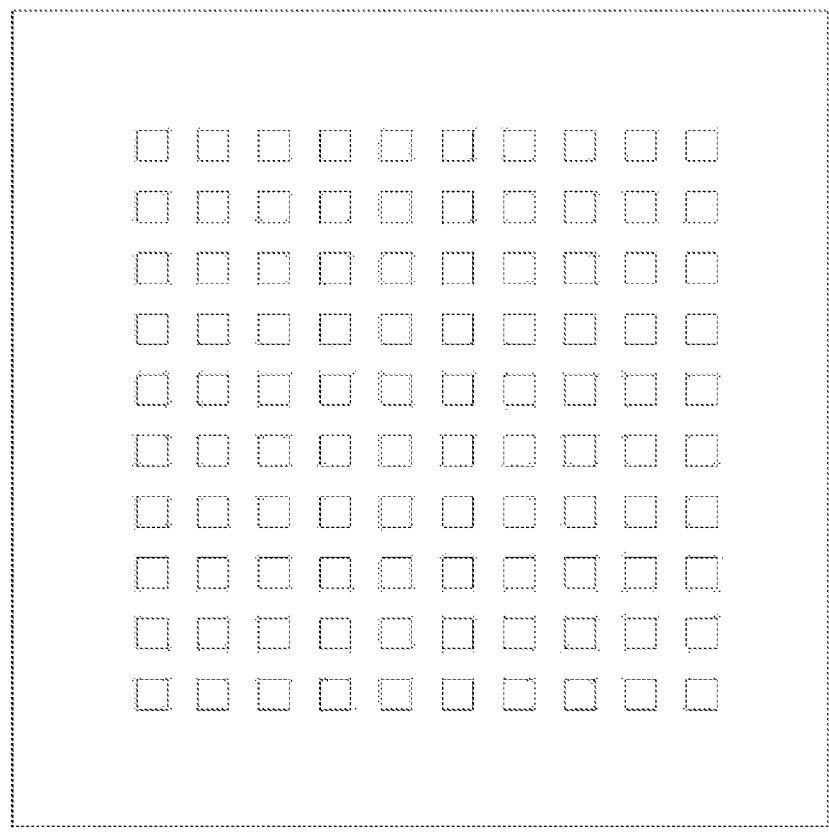
FIG. 12B is a schematic planar structural diagram of finished individual LED package elements obtained by extending according to the present invention.
Figure 13A:
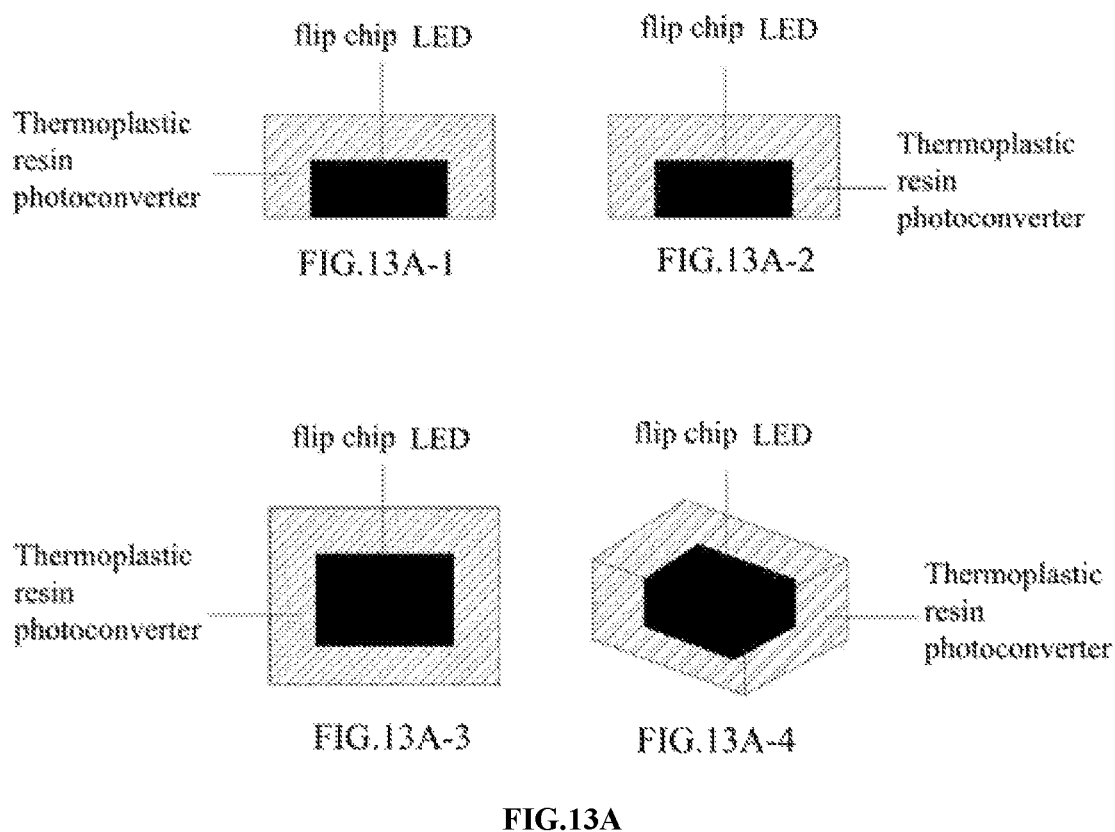
FIG. 13A shows a cambered-surface LED package element manufactured according to the present invention, where
Figure 13B:
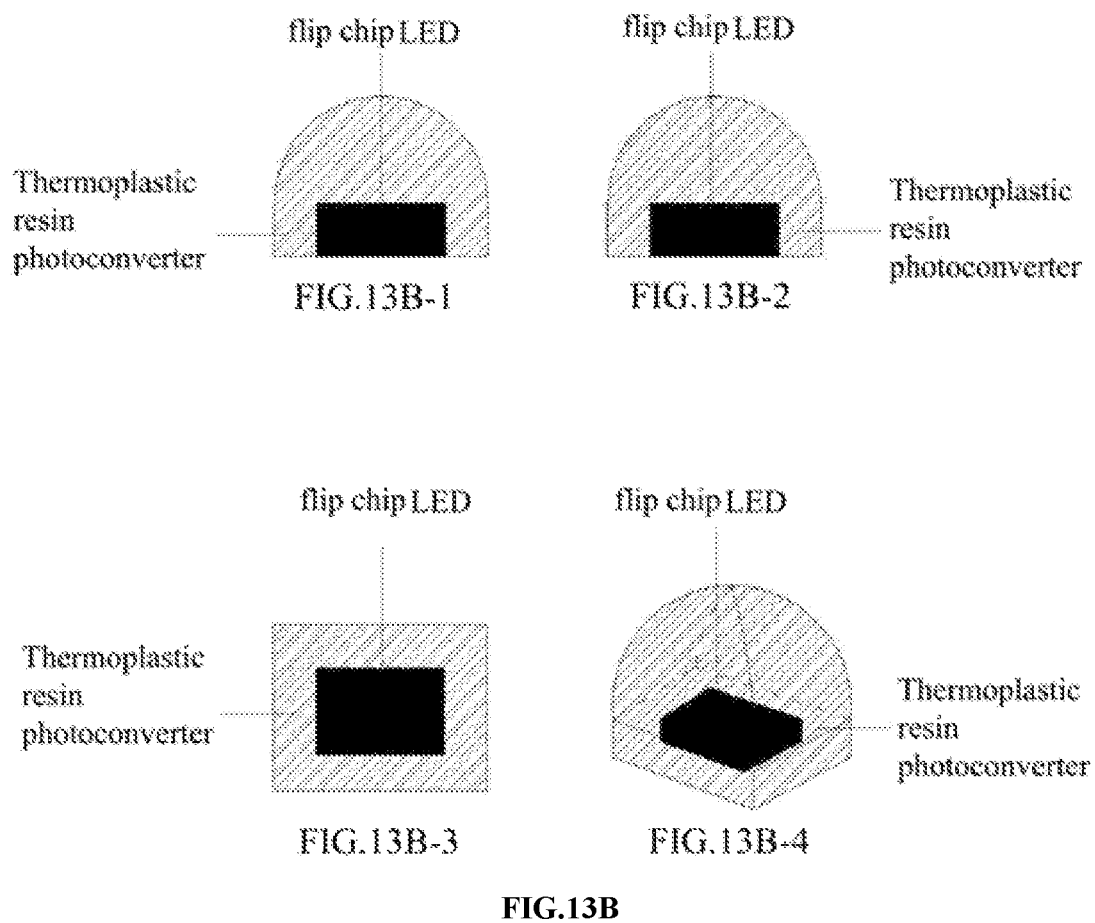
FIG. 13B shows a hemispheric-surface LED package element manufactured according to the present invention, where
Figure 13C:
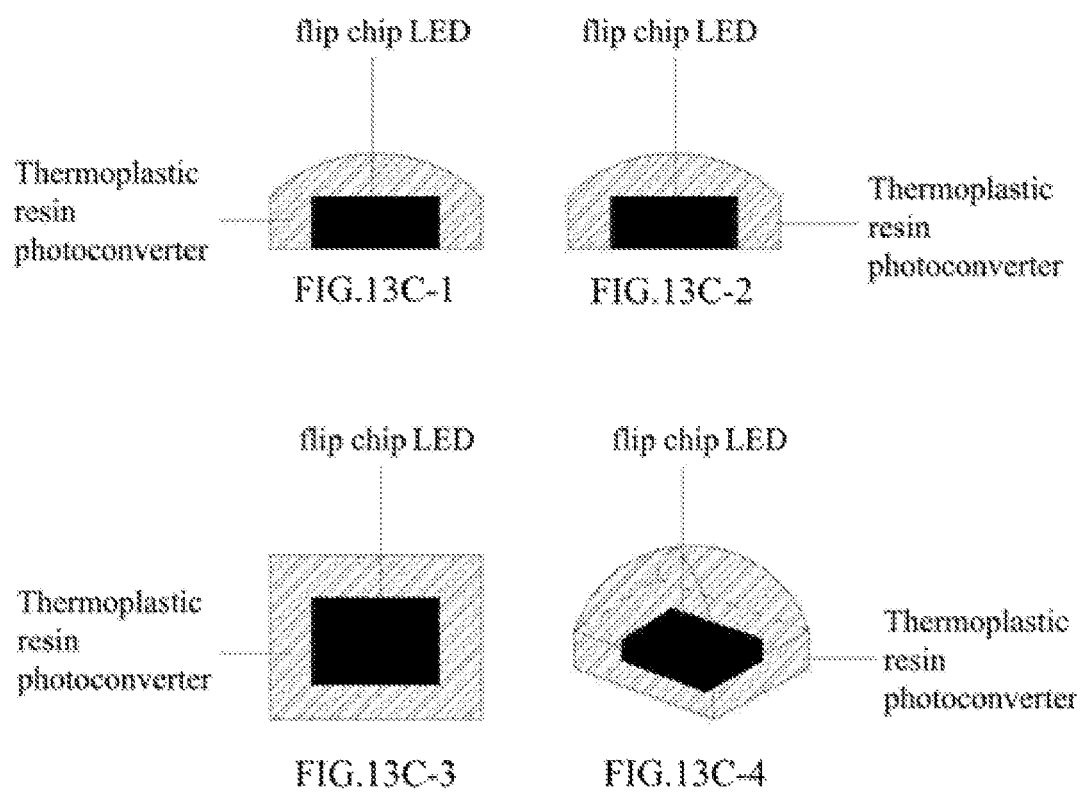
FIG. 13C shows a planar-surface LED package element manufactured according to the present invention, where

As required, an extender may be used to extend the extensible carrier sheet of the finished LED package elements in step 4, such that the finished LED package elements are split along the slits after being extended, to obtain finished individual LED package elements, as shown in FIG. 12A and FIG. 12B. Refer to FIG. 13A, FIG. 13B and FIG. 13C for the shape of the finished individual LED package elements.

The process for bond-packaging an LED using a thermoplastic resin photoconverter by rolling provided by the present invention is widely applicable to a packaging process of bonding the thermoplastic resin photoconverter to LED clip chips of different power.

Embodiment 2

The present invention provides an equipment system for bond-packaging an LED using a thermoplastic resin photoconverter by rolling, which includes: a cooperative roll-shaping and roll-cutting apparatus used for performing roll-shaping and roll-cutting on a photoconversion sheet, to form a photoconversion sheet array; and a roll-bonding apparatus used for laminating the photoconversion sheet array and a flip chip LED array. The cooperative roll-shaping and roll-cutting apparatus and the roll-bonding apparatus are arranged sequentially to form cooperatively linked process equipment, where the cooperative roll-shaping and roll-cutting apparatus includes a first rolling device with a protrusion array and a second rolling device with a recess array that are disposed face-to-face and aligned with each other, and the roll-bonding apparatus includes a fourth rolling device with a recess array and a third rolling device with a smooth rolling surface that are disposed face-to-face and aligned with each other.

In the cooperative roll-shaping and roll-cutting apparatus, cutters are provided on the periphery with protrusions of the protrusion array of the first rolling device and/or rims with recesses of the recess array of the second rolling device, as shown in FIG. 5A and FIG. 5B.

The first rolling device with a protrusion array is a first single-wheeled roller with a protrusion array or a first planar conveyor with a protrusion array. The second rolling device with a recess array is a second single-wheeled roller with a recess array or a second planar conveyor with a recess array. At least one of the first rolling device with a protrusion array and the second rolling device with a recess array is a single-wheeled roller.

The shape of each recess of a recess array on the second single-wheeled roller with a recess array or the second planar conveyor with a recess array is a cambered surface, a hemispheric surface or a planar surface.

In the first single-wheeled roller with a protrusion array or the first planar conveyor with a protrusion array, the shape of each protrusion of the protrusion array is the same as that of a flip chip, and dimensions of the length, width, and height of the protrusion are 1.01 to 1.05 times of those of the flip chip.

The fourth rolling device with a recess array in the roll-bonding apparatus is a fourth single-wheeled roller with a recess array or a fourth planar conveyor with a recess array.

The third rolling device in the roll-bonding apparatus is a third single-wheeled roller with a smooth surface or a third planar conveyor with a smooth plane, where at least one of the fourth rolling device and the third rolling device is a single-wheeled roller.

The shape of each recess of the recess array in the fourth single-wheeled roller or the fourth planar conveyor is the same as the shape of each recess of the recess array in the second single-wheeled roller or the second planar conveyor.

The second rolling device in the cooperative roll-shaping and roll-cutting apparatus and the fourth rolling device in the roll-bonding apparatus are the same device having dual functions.

It should be further noted that, specific implementations of the cooperative roll-shaping and roll-cutting apparatus and the roll-bonding apparatus are as follows:

Referring to FIG. 4, the first rolling device is the first single-wheeled roller with a protrusion array, the second rolling device is the second single-wheeled roller with a recess array, the third rolling device is the third single-wheeled roller with a smooth surface, and the fourth rolling device is the second single-wheeled roller with a recess array. In this embodiment, the fourth single-wheeled roller with a recess array and the second single-wheeled roller with a recess array are the same device.

Referring to FIG. 6, the first rolling device is the first single-wheeled roller with a protrusion array, the second rolling device is the second single-wheeled roller with a recess array, the third rolling device is the third single-wheeled roller with a smooth surface, and the fourth rolling device is the fourth single-wheeled roller with a recess array.

Referring to FIG. 9, the first rolling device is the first single-wheeled roller with a protrusion array, the second rolling device is the second planar conveyor with a recess array, the third rolling device is the third single-wheeled roller with a smooth surface, and the fourth rolling device is the second planar conveyor with a recess array. In this embodiment, the fourth planar conveyor with a recess array and the second planar conveyor with a recess array are the same device.

Referring to FIG. 11A and FIG. 11B, the first rolling device is the first single-wheeled roller with a protrusion array, the second rolling device is the second single-wheeled roller with a recess array, the third rolling device is the third single-wheeled roller with a smooth surface, and the fourth rolling device is the fourth planar conveyor with a recess array.

The planar conveyor is a device using two or more rollers to bear a planar conveyor belt and drive it to move ahead, where at least one of the rollers is driven by a motor.

The equipment system further includes a cooling and curing apparatus for fabricating finished LED package elements, where the cooling and curing apparatus is process equipment located at a rear end of the roll-bonding apparatus.

The cooling and curing apparatus is a tunnel-type multi-temperature-zone apparatus provided with a temperature control component and a conveyor belt passage.

The equipment system further includes a double-roller roll-laminating apparatus for preparing a photoconversion sheet, where the double-roller roll-laminating apparatus is process equipment located at a front end of the cooperative roll-shaping and roll-cutting apparatus.

The double-roller roll-laminating apparatus includes a first smooth-surface double-roller roll laminator. The first smooth-surface double-roller roll laminator includes two smooth-surface single-wheeled rollers each having a smooth rolling surface, where the two smooth-surface single-wheeled rollers perform rolling face-to-face in an alignment manner.

The double-roller roll-laminating apparatus further includes a second smooth-surface double-roller roll laminator. The second smooth-surface double-roller roll laminator includes two smooth-surface single-wheeled rollers each having a smooth rolling surface, where the two smooth-surface single-wheeled rollers perform rolling face-to-face in an alignment manner, as shown in FIG. 3.

A distance between two rollers of the first smooth-surface double-roller roll laminator is no more than 850 μm. A distance between two rollers of the second smooth-surface double-roller roll laminator B is no more than 800 μm.

The equipment system further includes a melting and blending apparatus for blending at least thermoplastic resin and a photoconversion material, where the melting and blending apparatus is process equipment located at a front end of the double-roller roll-laminating apparatus.

The melting and blending apparatus, the double-roller roll-laminating apparatus, the roll-shaping and roll-cutting cooperative apparatus, the roll-bonding apparatus, and the cooling and curing apparatus are sequentially and cooperatively linked, to form flow-type continuous process equipment, as shown in FIGS. 2, 6, 8, and 10.

The equipment system for bond-packaging an LED using a thermoplastic resin photoconverter by rolling provided by the present invention is widely applicable to a new packaging process implemented by bonding various thermoplastic resin photoconverters to LED clip chips of different power.

Any description that is not involved in the specific implementations of the present invention belongs to well-known technology in the art and can be implemented with reference to the well-known technology.

The present invention gains a satisfactory trial result after repeated test and verification.

The foregoing specific implementations and embodiments give a specific support for a technical idea of a process for bond-packaging an LED using a thermoplastic resin photoconverter by rolling according to the present invention, and are not intended to limit the protection scope of the present invention. Any equivalent changes or modifications made on the basis of the technical solutions according to the technical idea proposed in the present invention still fall within the protection scope of the technical solutions of the present invention.

What is claimed is:

1. A process method for bond-packaging an LED using a thermoplastic resin photoconverter by rolling, comprising at least the following continuous process flow: preparation of a photoconversion sheet, roll-shaping and roll-cutting of a photoconversion sheet array, forming of LED package elements by roll-bonding, and curing of the LED package elements, comprising the following basic steps:

step 1: preparation of a photoconversion sheet: acquiring a photoconversion sheet formed by at least the thermoplastic resin and a photoconversion material;

step 2: roll-shaping and roll-cutting of a photoconversion sheet array: in a vacuum condition, performing roll-shaping and roll-cutting on the photoconversion sheet in step 1 cooperatively by using a first rolling device with a protrusion array and a second rolling device with a recess array that are disposed face-to-face and aligned with each other, to obtain a photoconversion sheet array formed by individual photoconversion sheets with recesses, a slit for separating the individual photoconversion sheets being formed between every two individual photoconversion sheets in the photoconversion sheet array;

step 3: forming of LED package elements by roll-bonding: in a vacuum condition, performing roll-bonding on the photoconversion sheet array in step 2 and a flip chip LED array with a carrier sheet, the photoconversion sheet array and the flip chip LED array facing each other and being aligned with each other, such that flip chip LEDs in the flip chip LED array are bonded to and embedded in the recesses on the individual photoconversion sheets of the photoconversion sheet array, to obtain LED package elements, the flip chip LED referring to an individual flip chip LED or a flip chip LED assembly, and the flip chip LED assembly being composed of two or more individual flip chip LEDs; and step 4: curing of the LED package elements: in a vacuum condition, curing the LED package elements by cooling, such that the individual photoconversion sheets bonded to the flip chip LED array contract and naturally close up, to obtain finished LED package elements.

2. The process method for bond-packaging an LED using a thermoplastic resin photoconverter by rolling according to claim 1, wherein the preparation of a photoconversion sheet in step 1 refers to rolling a mixed slurry containing at least the thermoplastic resin and the photoconversion material by using smooth-surface double rollers in a vacuum heating condition, to obtain the photoconversion sheet.

3. The process method for bond-packaging an LED using a thermoplastic resin photoconverter by rolling according to claim 2, wherein the rolling mixed slurry by using smooth-surface double rollers to obtain the photoconversion sheet refers to: first rolling and molding the mixed slurry by using a first smooth-surface double-roller roll laminator, to obtain a rough photoconversion sheet; and then rolling and molding the molded rough photoconversion sheet by using a second smooth-surface double-roller roll laminator, to obtain a refined photoconversion sheet.

4. The process method for bond-packaging an LED using a thermoplastic resin photoconverter by rolling according to claim 3, wherein the thickness of the rough photoconversion sheet is no more than 850 μm, and the thickness of the refined photoconversion sheet is no more than 800 μm.

5. The process method for bond-packaging an LED using a thermoplastic resin photoconverter by rolling according to claim 2, wherein the rolling mixed slurry by using smooth-surface double rollers to obtain the photoconversion sheet refers to: rolling and molding the mixed slurry by using three or more sets of double rollers, to obtain a refined photoconversion sheet, the thickness of the refined photoconversion sheet being no more than 800 μm.

6. The process method for bond-packaging an LED using a thermoplastic resin photoconverter by rolling according to claim 4, wherein the temperature of the mixed slurry in step 1 ranges from 180° C. to 320° C.

7. The process method for bond-packaging an LED using a thermoplastic resin photoconverter by rolling according to claim 6, wherein the photoconversion material in step 1 is a quantum dot fluorophor, and the photoconversion sheet is a quantum dot fluorophor sheet; or the photoconversion material in step 1 is fluorescent powder, and the photoconversion sheet is a fluorophor sheet.

8. The process method for bond-packaging an LED using a thermoplastic resin photoconverter by rolling according to claim 7, wherein materials of the mixed slurry comprise an adhesive.

9. The process method for bond-packaging an LED using a thermoplastic resin photoconverter by rolling according to claim 1, wherein step 2 of performing roll-shaping and roll-cutting on the photoconversion sheet cooperatively by using a first rolling device with a protrusion array and a second rolling device with a recess array that are disposed face-to-face and aligned with each other refers to: performing roll-shaping and roll-cutting on the photoconversion sheet simultaneously by using the first rolling device with a protrusion array and the second rolling device with a recess array that are disposed face-to-face and aligned with each other, that is, simultaneously carrying out roll-shaping and roll-cutting, to achieve the two functions at the same time.

10. The process method for bond-packaging an LED using a thermoplastic resin photoconverter by rolling according to claim 9, wherein step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping on the photoconversion sheet by using the first rolling device with a protrusion array and the second rolling device with a recess array, to obtain a photoconversion sheet array formed by individual photoconversion sheets with recesses, wherein cutters are provided on the periphery of protrusions of the protrusion array and/or the rims of recesses of the recess array, such that roll-cutting for forming a slit is performed on the photoconversion sheet while roll-shaping is performed, thereby forming slits for separating the individual photoconversion sheets.

11. The process method for bond-packaging an LED using a thermoplastic resin photoconverter by rolling according to claim 10, wherein step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first single-wheeled roller with a protrusion array and a second single-wheeled roller with a recess array, the first rolling device with a protrusion array being the first single-wheeled roller with a protrusion array, the second rolling device with a recess array being the second single-wheeled roller with a recess array, and cutters being provided on the periphery of protrusions of the first single-wheeled roller of a protrusion array and/or the rims of recesses of the second single-wheeled roller with a recess array; or step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first single-wheeled roller with a protrusion array and a second planar conveyor with a recess array, the first rolling device with a protrusion array being the first single-wheeled roller with a protrusion array, the second rolling device with a recess array being the second planar conveyor with a recess array, and cutters being provided on the periphery of protrusions of the first single-wheeled roller with a protrusion array or the rims of recesses of the second planar conveyor with a recess array; or step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first planar conveyor with a protrusion array and a second single-wheeled roller with a recess array, the first rolling device with a protrusion array being the first planar conveyor with a protrusion array, the second rolling device with a recess array being the second single-wheeled roller with a recess array, and cutters being provided on the periphery of protrusions of the first planar conveyor with a protrusion array and/or the rims of recesses of the second single-wheeled roller a recess array.

12. The process method for bond-packaging an LED using a thermoplastic resin photoconverter by rolling according claim 11, wherein the shape of each individual photoconversion sheet in the photoconversion sheet array formed by the individual photoconversion sheets with recesses in step 2 is a cambered surface, a hemisphere hemispheric surface, or a rectangle planar surface.

13. The process method for bond-packaging an LED using a thermoplastic resin photoconverter by rolling according to claim 12, wherein the temperature of cooperative roll-shaping and roll-cutting in step 2 ranges from 120° C. to 250° C.

14. The process method for bond-packaging an LED using a thermoplastic resin photoconverter by rolling according to claim 13, wherein the depth of the slit in step 2 is 50% to 100% of the thickness of the refined photoconversion sheet.

15. The process method for bond-packaging an LED using a thermoplastic resin photoconverter by rolling according to claim 13, wherein the width of the slit in step 2 is no more than 20 μm.

16. The process method for bond-packaging an LED using a thermoplastic resin photoconverter by rolling according to claim 15, wherein dimensions of the length, width, and height of each recess on the photoconversion sheet array formed by the individual photoconversion sheets with recesses in step 2 are 1.01 to 1.05 times of those of a flip chip LED.

17. The process method for bond-packaging an LED using a thermoplastic resin photoconverter by rolling according to claim 1, wherein
the roll-bonding in step 3 refers to: arranging the photoconversion sheet array on a fourth single-wheeled roller with a recess array or a fourth planar conveyor with a recess array, arranging the flip chip LED array with a carrier sheet on a third single-wheeled roller with a smooth rolling surface or a third planar conveyor with a smooth plane, and then performing roll-bonding, such that the flip chip LEDs in the flip chip LED array are bonded to and embedded in the recesses on the individual photoconversion sheets of the photoconversion sheet array, to obtain the LED package elements, at least one of the device arranged with the photoconversion sheet array and the device arranged with the flip chip LED array being a single-wheeled roller.

18. The process method for bond-packaging an LED using a thermoplastic resin photoconverter by rolling according to claim 17, wherein the temperature of the roll-bonding in step 3 ranges from 120° C. to 250° C.

19. The process method for bond-packaging an LED using a thermoplastic resin photoconverter by rolling according to claim 1, wherein
the curing by cooling in step 4 is curing by gradient cooling or curing by steady cooling;
the curing by gradient cooling refers to decreasing the temperature of the LED package elements to room temperature along multiple gradients, duration of the curing by cooling being 3 min to 10 min, and duration of each stage of the curing by cooling being adjustable; and
the curing by steady cooling refers to decreasing the temperature of the LED package elements to room temperature steadily, duration of the curing by cooling being 3 min to 10 min.

20. The process method for bond-packaging an LED using a thermoplastic resin photoconverter by rolling according to claim 1, wherein the carrier sheet in the flip chip LED array with a carrier sheet in step 3 is an extensible carrier sheet.

21. The process method for bond-packaging an LED using a thermoplastic resin photoconverter by rolling according to claim 20, wherein a material of the extensible carrier sheet in step 3 is one of heat-resistant polyester, polydimethylsiloxane, and polyvinyl chloride.

22. The process method for bond-packaging an LED using a thermoplastic resin photoconverter by rolling according to claim 21, wherein an extender is used to extend the extensible carrier sheet of the finished LED package elements in step 4, such that the finished LED package elements are split along the slits upon being extended, to obtain finished individual LED package elements.

\* \* \* \* \*